United States Patent [19]

Chen

[11] Patent Number: 5,483,154
[45] Date of Patent: Jan. 9, 1996

[54] APPARATUS FOR DETECTING SIGNAL FREQUENCY AND CONTROLLING INDICATING DEVICE

[75] Inventor: Shyi-Hon Chen, Taipei, Taiwan

[73] Assignee: Acer Peripherals Incorporated, Taiwan

[21] Appl. No.: 132,149

[22] Filed: Oct. 5, 1993

[51] Int. Cl.⁶ ............................................. H03K 9/06
[52] U.S. Cl. ........................ 324/76.66; 327/37; 327/31; 327/131
[58] Field of Search ................................. 307/522, 523, 307/234; 328/140; 327/131, 37, 36, 47; 324/76.66, 76.72

[56] References Cited

U.S. PATENT DOCUMENTS

| | | | |
|---|---|---|---|
| 3,349,256 | 10/1967 | Rohner | 307/522 |
| 3,594,588 | 7/1971 | Evans | 307/522 |
| 3,610,957 | 10/1971 | Hiscox | 307/522 |
| 3,653,018 | 3/1972 | Budryz | 307/522 |
| 4,322,642 | 3/1982 | Sugasawa | 307/522 |
| 4,603,357 | 7/1986 | Ramirez | 307/234 |

*Primary Examiner*—Kenneth A. Wieder
*Assistant Examiner*—Jose M. Solis
*Attorney, Agent, or Firm*—Townsend and Townsend and Crew

[57] ABSTRACT

An apparatus and a method for discriminating the frequency of an input signal and for providing a binary output signal. The binary output signal can be used to control an indicating device and/or other circuitry. A sawtooth wave is started at zero crossings. An integral of the sawtooth wave is then compared with a threshold reference. The output signal indicates if the input signal frequency is above or below a threshold frequency.

6 Claims, 4 Drawing Sheets

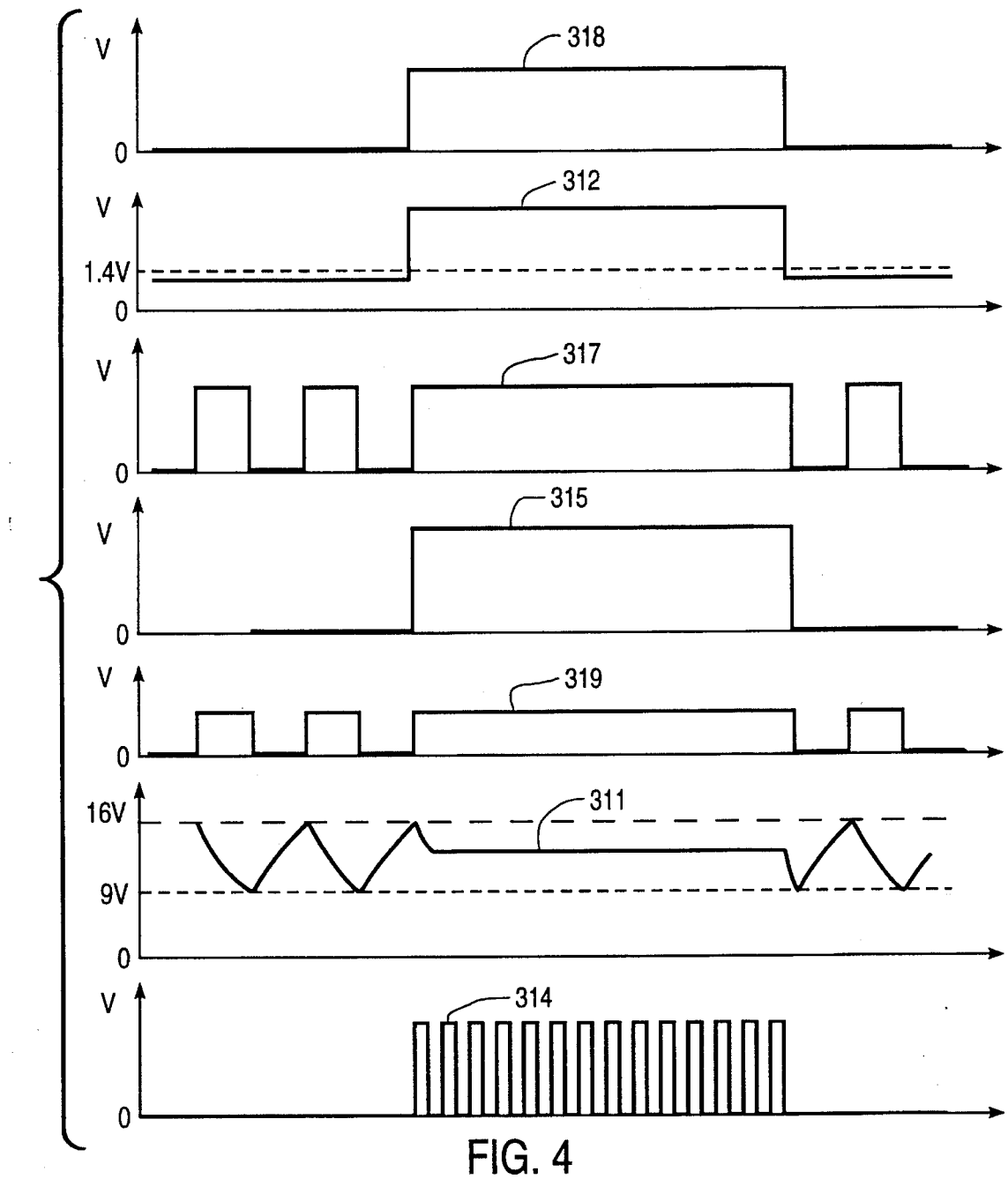
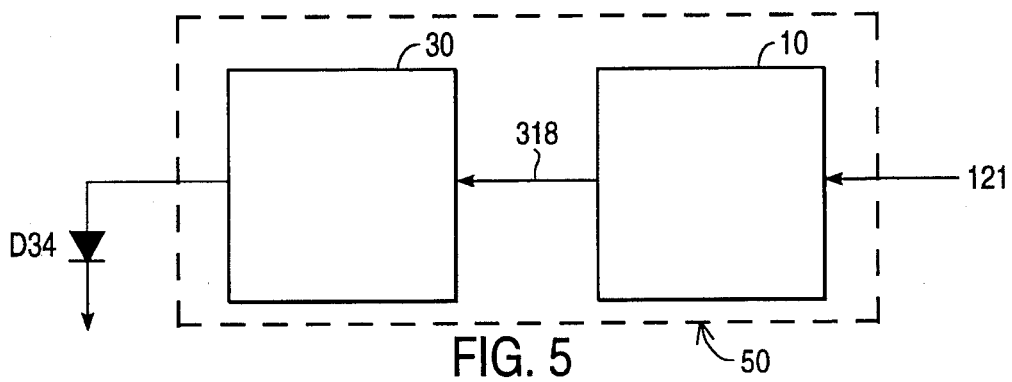
FIG. 4
FIG. 5

5,483,154

APPARATUS FOR DETECTING SIGNAL FREQUENCY AND CONTROLLING INDICATING DEVICE

BACKGROUND OF THE INVENTION

The present invention relates generally to frequency determination and more specifically to determining whether the frequency of an input signal exceeds a reference frequency or falls below a possibly different reference frequency.

In certain applications, it is desirable to determine whether the frequency of an input signal exceeds a predetermined reference frequency or falls below another possibly different predetermined reference frequency. Such a determination can be adapted for use to control other circuitry in response to the frequency of the input signal. For example, a frequency determination circuit can be adapted to control, in response to the frequency of an input signal, the amount of power supplied to an air conditioning unit, a lamp, or a computer peripheral such as a display monitor or a printer. In other contexts, a frequency determination circuit can be adapted to monitor the frequency of an input signal, and to inform the user, through means perceptible to the human senses, of the status of the input signal.

It has long been recognized in the production of electronic circuits that production costs are directly correlated with circuit complexity. Thus, there is desired a simple, inexpensive circuit which can determine whether the frequency of a given input signal exceeds a certain frequency threshold or falls below another possibly different frequency threshold, and can output a control signal and/or notify the human operator in response to that determination.

SUMMARY OF THE INVENTION

The present invention relates to an apparatus and a method for determining whether the frequency of a given input signal exceeds a predetermined frequency threshold or falls below the same or another predetermined frequency threshold.

In one aspect of the invention, the apparatus outputs a binary signal for use in controlling other circuitry. In one embodiment, the binary output signal exhibits one state upon determining that the frequency of the input signal exceeds a predetermined reference frequency. On the other hand, if the frequency of the input signal falls below another predetermined reference frequency, the binary output signal exhibits another state.

In another embodiment, only one predetermined reference frequency is used. Consequently, the binary output signal exhibits one state when the frequency of the input signal exceeds that one predetermined reference frequency. If the frequency of the input signal does not exceed that one predetermined frequency, the binary output signal would exhibit another state.

In another embodiment, the circuit of the present invention can be used in a computer system to control the amount of power supplied to a display monitor or to a printer. Certain computer systems produce vertical synchronization signals of predetermined frequencies. In response to the frequency of a vertical synchronization signal, the circuit of the present invention can cause a display monitor or a printer to function either in the normal mode or in the power-saving mode. For example, when the frequency of a vertical synchronization signal is above 50 Hertz, the display monitor can be enabled by the circuit to function in the normal mode. When the frequency drops below 20 Hertz, the circuit causes the display monitor to enter the power-saving mode.

In another aspect of the invention, the apparatus lights a light-emitting diode, or activates other similar devices whose output is perceptible to the human senses, such as bells, buzzers, cathode ray tubes, etc., when the frequency of an input signal exceeds a predetermined reference frequency. Alternatively, the circuit causes the light-emitting diode to blink when the frequency of an input signal falls below another predetermined frequency threshold.

In the previous example, a light-emitting diode (LED) may be enabled, disabled, or blinked in response to a determination by such a circuit of whether the frequency of the vertical synchronization signal exceeds 50 Hertz or falls below 20 Hertz. The user is thus notified whether a peripheral device, such as a display monitor, functions in the normal, expected mode or in the power-saving mode. It is immaterial to the present invention whether the LED is designed to be enabled, disabled, or blinked in response to a determination by the frequency determination circuit as long as the user is notified in some fashion, whether visual, audible, or otherwise, that the frequency of the input signal has been determined to exceed a predetermined reference frequency or fall below another predetermined reference frequency.

As previously discussed, it is contemplated that in some embodiments only one predetermined reference frequency may be used. In one embodiment, when only one predetermined reference frequency is used, the light emitting diode would be enabled when the frequency of the input signal exceeds the one predetermined reference frequency. If the frequency of the input signal falls below that one predetermined reference frequency, the light emitting diode blinks.

In yet another embodiment, the circuit of the present invention both notifies the human operator via means perceptible to the human senses and controls other circuitry upon determining that the frequency of an input signal exceeds a predetermined threshold frequency or falls below another predetermined threshold frequency. As previously discussed, it is contemplated that only one predetermined reference frequency may be used in some embodiments. In such a case, the circuit of the present invention would appropriately notify the human operator and control other circuitry depending upon whether frequency of the input signal exceeds that one predetermined reference frequency.

A further understanding of the nature and advantages of the present invention may be realized by reference to the remaining portion of the specification and the attached drawings.

BRIEF DESCRIPTION OF THE DRAWINGS

FIG. 4 is a timing diagram for the circuit of FIG. 3; and

FIG. 5 shows a particular use of the circuit embodiments of the present invention.

DESCRIPTION OF SPECIFIC EMBODIMENTS

Figure 1:
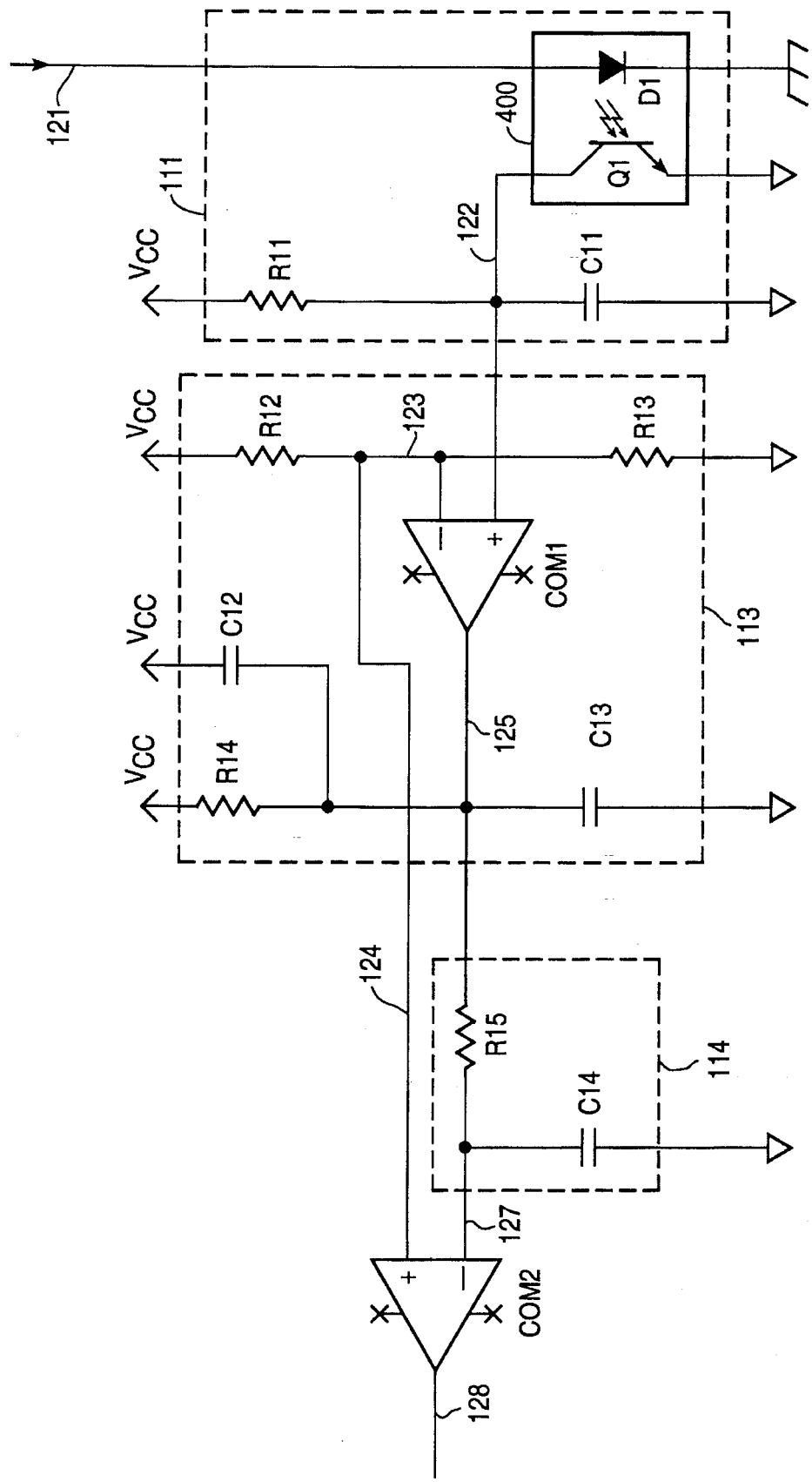
FIG. 1 shows a first circuit embodiment of the present invention.
Figure 2:
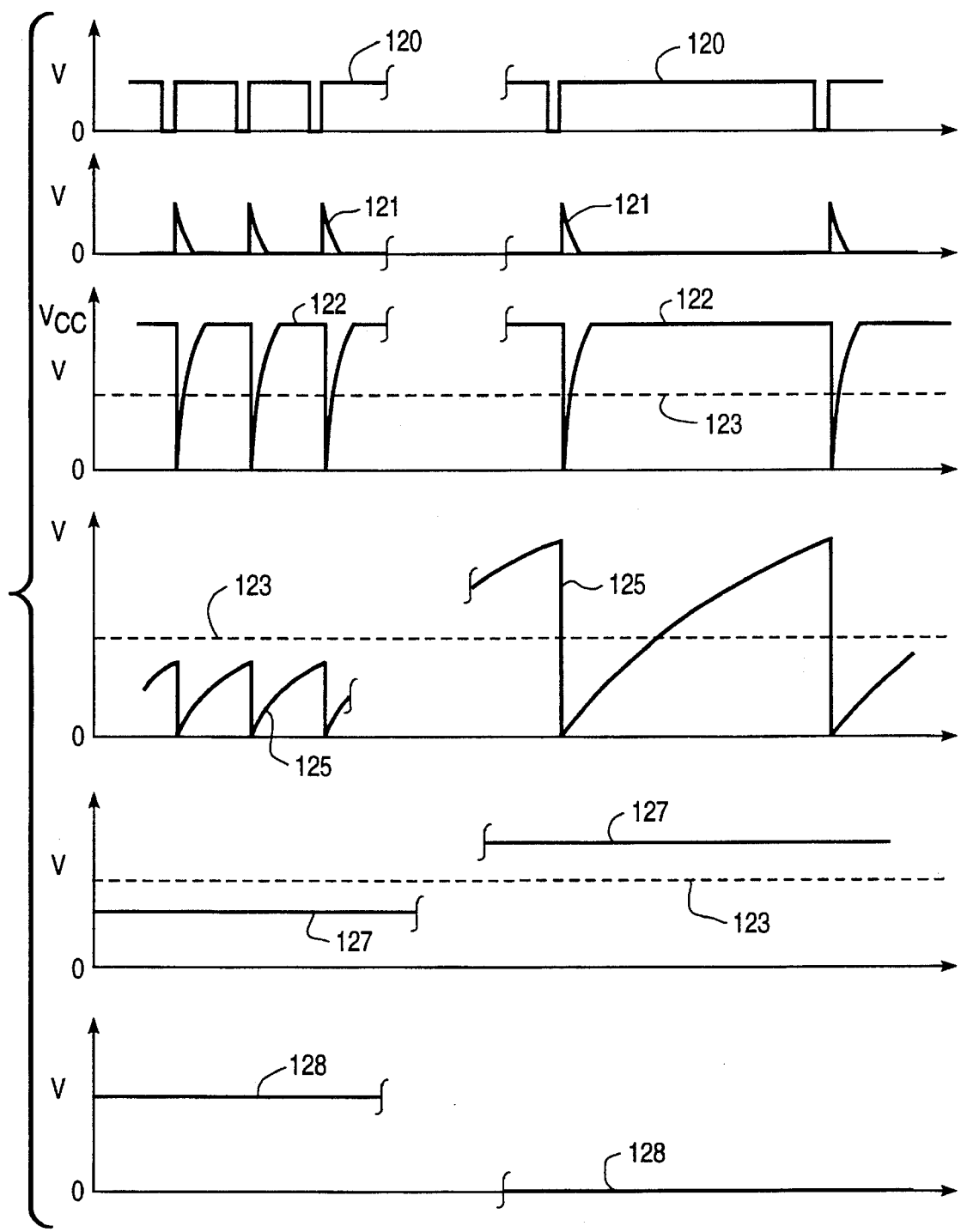
FIG. 2 is a timing diagram for the circuit of FIG. 1.

FIG. 1 is a circuit diagram of a frequency determination circuit 10 according to a first embodiment of the present invention. FIG. 2 is a timing diagram showing the relationship among the corresponding signals. An input signal 121 having positive pulses, may be obtained by differentiating a vertical synchronization signal 120 from a computer system, for example. The timing diagram of FIG. 2 shows a first time interval where signal 120 (and hence signal 121) is at a relatively high frequency and a later time interval where signal 120 is at a lower frequency.

A photocoupler 400 consisting of a diode D1 and a NPN bipolar transistor Q1 converts input signal 121 into a signal 122. Photocoupler 400 along with a resistor R11 and a capacitor C11 make up a pulse-width regulating circuit 111 whose function is to keep the pulse width of signal 122 stable for a given frequency. Consequently, the pulse width of signal 122 is fixed for a given frequency regardless of whether the positive pulses of input signal 121 are of different pulse widths.

When the voltage of input signal 121 is higher than a certain value (around 0.7 volts in this embodiment), transistor Q1 conducts and capacitor C11 discharges. Signal 122 is pulled down almost immediately to about ground level because transistor Q1 is saturated and resistor R11 and capacitor C11 are designed to have a low RC time constant. When the voltage of input signal 121 is lower than about 0.7 volt, transistor Q1 is off and current flows from a power source Vcc through resistor R11 to charge up capacitor C11. Thus signal 122 reaches a high level after certain period of time (determined by the RC time constant R11*C11). The waveform of signal 122 is hence as shown in FIG. 2 and the width of the negative pulses are regulated by pulse-width regulating circuit 111.

Signal 122 is then fed to the positive input terminal of a comparator COM1, which is an operational amplifier in this embodiment, to be compared with a reference signal 123. Comparator COM1 is a part of a first comparison circuit 113. As can be readily appreciated by those of ordinary skill in the art, if no other circuit is connected to the output terminal of comparator COM1, a comparator output 125 is a square wave which is high when signal 122 is higher than reference signal 123 and which is low when signal 122 is lower than reference signal 123. In this embodiment, however, a capacitor C13 is connected to the output terminal 125 of COM1. Consequently, charge and discharge occur.

Moreover, the charging path includes a resistor R14 and a capacitor C12. R14 and C12 work in a similar way as a constant current source. Consequently upon charging capacitor C13, the waveform of signal 125 is more of a linear rise instead of an exponential one. This linear rise results in a sawtooth-like signal 125 whose slope (rising rate) remains almost constant regardless of the frequency of the input signal 121. COM1, resistors R12, R13, R14, and capacitors C12, C13 form the first comparison circuit 113.

Because higher frequency signal 122 has a shorter charging time and the current is almost constant, its corresponding comparator output signal 125 has a smaller peak value. Reference signal 123 is designed such that its voltage falls in between the peak voltage of a signal having the high frequency threshold, e.g., 50 Hz, and the peak voltage of a signal having the low frequency threshold, e.g. 20 Hz.

A filter circuit 114 containing a resistor R15 and a capacitor C14 then filters out the AC portion of comparator output signal 125 to produce a filter output signal 127. Filter output signal 127 represents the DC component of comparator signal 125. A second reference signal is designed such that the voltage of filter output signal 127 is higher than the second reference signal when input signal 121 has a high frequency (50 Hz) and lower than second reference signal 124 when input signal 121 has a lower frequency (20 Hz).

In this particular embodiment, however, the second reference signal is the same as reference signal 123. As is readily apparent from FIG. 1, the voltage of reference signal 123 can be adjusted by varying the resistance of resistor R12 and resistor R13. A comparator COM2, which is an operational amplifier in this embodiment, compares the voltages of filter output signal 127 and reference signal 124, and generates a binary output signal 128. If filter output signal 127 is lower than reference signal 124, binary output signal 128 is HIGH; if filter output signal 127 is higher, then binary output signal 128 is LOW. If comparator COM2 has an open collector type of output stage, as this embodiment does, binary output signal 128 is "floating" when it's HIGH and grounded to zero volts when it's LOW.

Significantly, this embodiment of the invention does not require a constant current source to be placed in the circuit to generate a sawtooth-like transition signal. Only a resistor and a capacitor are needed, thus keeping the production cost low while still achieving the expected function.

Figure 3:
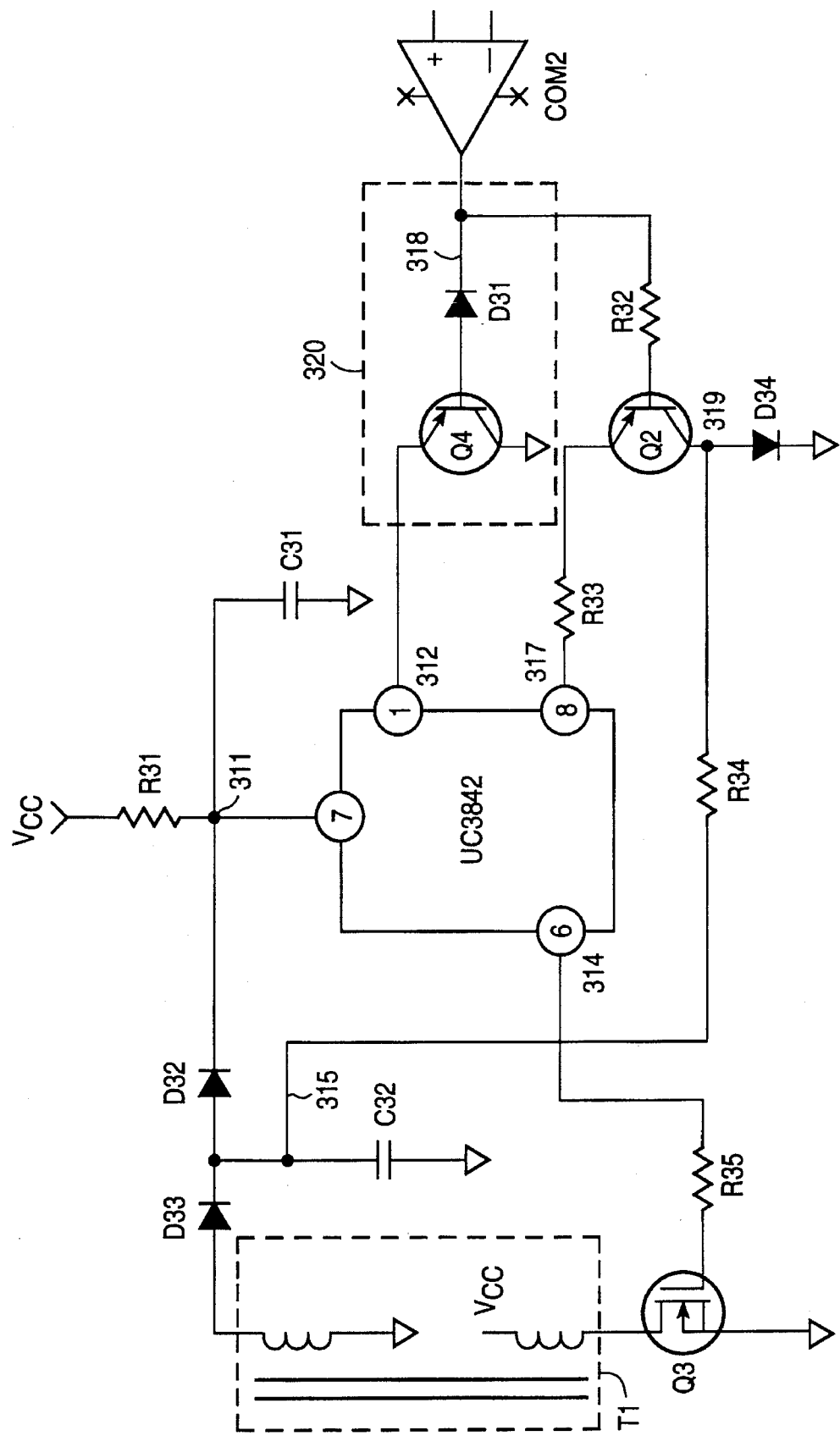
FIG. 3 shows a second circuit embodiment of the present invention.

FIG. 3 is a circuit diagram of circuit 30 according to another embodiment of the present invention. A current mode pulse width modulation (PWM) controller linear integrated circuit (IC) made by SGS-Thompson Microelectronics, UC3842, whose data sheets are herein incorporated by reference for all purposes, is employed as the central control circuit of circuit 30. UC3842 is usually applied to a switching power supply system used in a display monitor. Please refer to commonly assigned U.S. patent application Ser. No. 07/928,847, filed Aug. 11, 1992 for more details.

The operation of the circuit can best be understood in view of the basic operating principles of UC3842. A power input terminal 7 is a terminal to receive an external power supply, namely Vcc. UC3842 will not be enabled unless the voltage at the power input terminal 7 reaches at least 16 volts. Once UC3842 begins to work, it stays enabled until the voltage at power input terminal 7 drops down below 9 volts. In other words, the on/off characteristic of UC3842 has hysteresis. Furthermore, a current greater than 10 mA needs to be delivered to power input terminal 7 to keep UC3842 working. When UC3842 is enabled, it provides a 5-volt DC power signal at DC power output terminal 8. A control terminal 1 is the control terminal that controls the signal present at a control terminal 6. Control terminal 6 initiates a positive pulse train only if the voltage at control terminal 1 is higher than 1.4 volts and UC3842 is enabled.

With this understanding of UC3842, it is possible to describe the circuit in FIG. 3. Power input terminal 7 receives a constant current supplied by external power source Vcc. A resistor R31 is selected so as to keep the current of a signal 311 stable at about 1 mA. The current of signal 311 charges a capacitor C31. UC3842 starts working when its power input terminal 7 reaches 16 volts and sends out a 5-volt DC power signal 317 at DC power output terminal 8. A control signal 314 in the form of a positive pulse train is provided at control terminal 6 only if the voltage at a control terminal 1 is over 1.4 volts. If the voltage of control terminal 1 is below 1.4 volts, there will be no pulse train at control terminal 6.

An input signal 318 is sent to an input control circuit 320 including a PNP bipolar transistor Q4 and a diode D31. Input signal 318 could be, for example, output signal 128 of the above-described embodiment. Input signal 318 is floated (open) when in the HIGH state and grounded to 0 volts when in the LOW state. Consider that input signal 318 is HIGH (open), no current can be sunk to the output terminal of comparator COM2. Consequently, Q4 is off. The characteristic of control terminal 1 of UC3842 is such that it has a DC voltage ranging from 1.5 to about 4 volts when no other circuit is connected to terminal 1. Because transistor Q4 is off, control terminal 1 therefore keeps a voltage level above 1.4 volts. Consequently, control terminal 6 transmits control signal 314, in pulses, that turns on and off a MOS transistor Q3 through a resistor R35. The coils in a transformer T1 then induce energy and deliver the energy in current form through diodes D33 and D32 to power input terminal 7 of UC3842.

Recall that Vcc only provides a current of approximately 1 mA to power input terminal 7, not enough to keep UC3842 enabled. However, after UC3842 is enabled, capacitor C31 discharges and supplies the extra current necessary to keep UC3842 enabled. At some point in time, capacitor C31 will become partially discharged and the voltage at power input terminal 7 will fall below 9 volts. UC3842 will then become disabled.

However, the current coming from transformer T1 compensates the deficit shortly after UC3842 has been turned on. Consequently, the voltage at power terminal 7 is maintained at around 13 volts, keeping UC3842 enabled.

Meanwhile, a second PNP bipolar transistor Q2 is coupled to both the DC power output terminal 8 and a photodiode D34 for indication purpose. When signal 318 is high, transistor Q2 does not conduct. Consequently, photodiode D34 does not receive a DC power signal 317. However, current supply signal 315, generated by transformer T1, supplies power to the positive end of photodiode D34 through a resistor R34. Thus D34 is enabled and is kept enabled as long as input signal 318 remains HIGH. The timing diagram in FIG. 4 illustrates the operation of this embodiment in detail.

When input signal 318 is LOW, transistor Q4 and transistor Q2 are both on. When transistor Q4 conducts, the voltage of signal 312 (from control terminal) drops down below 1.4 volts (around 0.9 volts, which represents approximately the voltage drop of diode D31 plus the voltage drop between the emitter and the collector of the saturated transistor Q4). consequently, there is no pulse train at the control terminal 6. Transistor Q3 is turned off, and no current is generated by transformer T1.

As mentioned above, UC3842 requires a current of 10 mA to its power input terminal 7 to keep itself working. With no additional current supplied from transformer T1, signal 315 is at zero volt. Capacitor C31 will discharge, and the voltage of signal 311 keeps on falling until the voltage of signal 311 falls below 9 volts. Accordingly, UC3842 turns off, and the voltage of signal 317 (at power input terminal 8) drops to zero. Without the voltage supply from either signal 315 or signal 317, signal 319 is grounded. Consequently, photodiode D34 goes off. When signal 311 falls below 9 volts and controller UC3842 stops working, Vcc starts charging capacitor C31 again. Controller UC3842 is then enabled again when signal 311 reaches 16 volts. Signal 317 reaches 5 volts, and Q2 passes the voltage to photodiode D34 to light photodiode D34.

It can be seen from FIG. 4 that when input signal 318 is LOW, signal 311 is a sawtooth, and signal 319 is a square wave alternating between high and low levels. Thus photodiode D34 goes on and off; in other words, D34 blinks. The apparatus 30 therefore possesses the function of keeping photodiode D34 enabled when input signal 318 is HIGH and causing photodiode D34 to blink when input signal 318 is LOW.

FIG. 5 shows a particular use of the circuit embodiments of the present invention. A circuit 50 in FIG. 5 employs circuit 10 of FIG. 1 and circuit 30 of FIG. 3 in combination. The output signal of circuit 10 is employed as the input signal to circuit 30. By coupling the two circuits together, circuit 50 can, for example, notify the user of the power status of a display monitor connected to a computer system which provides power saving function. For example, circuit 50 can be installed in the display monitor of a computer system to receive a vertical synchronization signal as input signal 121. If input signal 121 has a frequency higher than 50 Hz, which specifies the normal mode of the monitor, then photodiode D34 stays lit, and output signal 318 can be used to control the appropriate amount of power supplied in the display monitor. If, on the other hand, the frequency of input signal 121 is below 20 Hz which specifies the power saving mode (very little power supplied to the monitor), then photodiode D34 blinks and output signal 318 is used to control the appropriate amount of power supplied to the display monitor. As can be appreciated from the above discussion, photodiode D34 of the present invention can be used to show the status of different operating modes of the display monitor by informing a computer user whether the monitor is in the normal operating mode (photodiode D34 stays enabled), the power saving mode (photodiode D34 blinks), or the totally off mode (photodiode D34 off).

While the above description provides a full and complete description of the preferred embodiments of the present invention, various modifications, alternate constructions, and equivalents may be employed while still remaining within the scope of the invention. For example, to a person of ordinary skill in the art, the central control element UC3842 in FIG. 3 can be replaced by other similar devices together with some minor modifications of the associated circuitry while still achieving the function of the invention. Furthermore, the circuits 10 and 30 of the present invention have applications other than controlling the amount of power supplied to display monitors and indicating the mode of operation of display monitors. For example, the present invention can be adapted to control, in response to variations in the frequency of an input signal, any circuit. As is apparent to those of ordinary skill in the art, the user can be notified of the status of the circuitry controlled via any means perceptible to the human senses.

Accordingly, the foregoing disclosure is intended to be illustrative, but not limiting, of the scope of the invention which is set forth in the following claims.

What is claimed is:

1. A method for discriminating the frequency of an input signal comprising the steps of:

comparing the voltage of the a first signal with the voltage of a first reference signal to generate a first transition signal;

shaping said first transition signal to form a sawtooth wave;

maintaining a relationship, between the integral of said sawtooth wave respect to a second reference signal, independent of the power source;

thereafter, filtering said first transition signal to obtain a second transition signal, said second transition signal representing the DC component of said first transition signal; and thereafter, comparing the voltage of said second transition signal with the voltage of said second reference signal to generate a binary output signal, said binary output signal having a first state when the voltage of said second transition signal exceeds the voltage of said second reference signal, and a second state when the voltage of said second transition signal does not exceed the voltage of said second reference signal.

2. The method of claim 1 further comprising the step of regulating the pulse width of said input signal prior to the step of comparing the voltage of said first signal with the voltage of said first reference signal.

3. The method of claim 1 wherein said first reference signal is the same as said second reference signal.

4. The method of claim 3 wherein said input signal is obtained by differentiating a vertical synchronization signal.

5. The method of claim 1 wherein the shaping step comprises charging and discharging a capacitor with said transition signal.

6. The method of claim 1 wherein the shaping and the maintaining steps comprise charging and discharging a first capacitor with said transition signal, said first capacitor being coupled to a second capacitor and a resistor, said second capacitor and said resistor maintaining the rise rate of said sawtooth wave approximately constant regardless of the frequency of said input signal.

* * * * *